United States Patent
Kawai et al.

[11] Patent Number: 5,625,294
[45] Date of Patent: Apr. 29, 1997

[54] APPARATUS FOR DETECTING SEATED CONDITION FOR TOILET SEAT

[75] Inventors: Shinji Kawai; Mitsugu Nonomura; Yuji Yamaguchi; Seiji Tanaka; Akira Takamata, all of Aichi, Japan

[73] Assignees: Aisin Seiki Kabushiki Kaisha, Kariya; Inax Corporation, Tokoname, both of Japan

[21] Appl. No.: 343,984

[22] Filed: Nov. 18, 1994

[30] Foreign Application Priority Data

Nov. 19, 1993 [JP] Japan ................... 5-290152

[51] Int. Cl.$^6$ ........................... A47K 3/22
[52] U.S. Cl. ........................ 324/668; 324/675; 324/661; 4/DIG. 3; 4/305; 4/250; 340/562
[58] Field of Search .............. 340/562; 4/305, 4/668, 250, DIG. 3, 215; 324/661, 686, 675

[56] References Cited

U.S. PATENT DOCUMENTS

| | | |
|---|---|---|
| 3,603,290 | 9/1971 | Ororck .................... 4/661 |
| 3,849,808 | 11/1974 | Olson ..................... 4/215 |
| 4,689,499 | 8/1987 | Yee . |
| 4,731,591 | 3/1988 | Weigand . |
| 4,748,700 | 6/1988 | Wooten ................... 4/661 |
| 4,796,013 | 1/1989 | Yasuda et al. . |
| 4,841,583 | 6/1989 | Ohara et al. . |

FOREIGN PATENT DOCUMENTS

| | | |
|---|---|---|
| 4258423 | 9/1992 | Japan . |
| 2075201 | 11/1981 | United Kingdom . |
| 2263549 | 7/1993 | United Kingdom . |

Primary Examiner—Kenneth A. Wieder
Assistant Examiner—Jose M. Solis
Attorney, Agent, or Firm—Sughrue, Mion, Zinn, Macpeak & Seas

[57] ABSTRACT

An apparatus for detecting seated condition for toilet seat which detects whether the change in input voltage of determining circuit, over predetermined time, in response to electrostatic capacity is existed or not. When the change is existed, the present apparatus computes and renews the set value 1 for detecting un-seated condition and the set value 2 for detecting seated condition based on the changed input potential.

Accordingly, the present apparatus is the apparatus for detecting whether a human is seated or un-seated on a toilet seat using electrostatic capacity and the present invention can reduce the error in detection caused by the change in electrostatic capacity owing to a person, temperature and humidity.

8 Claims, 4 Drawing Sheets

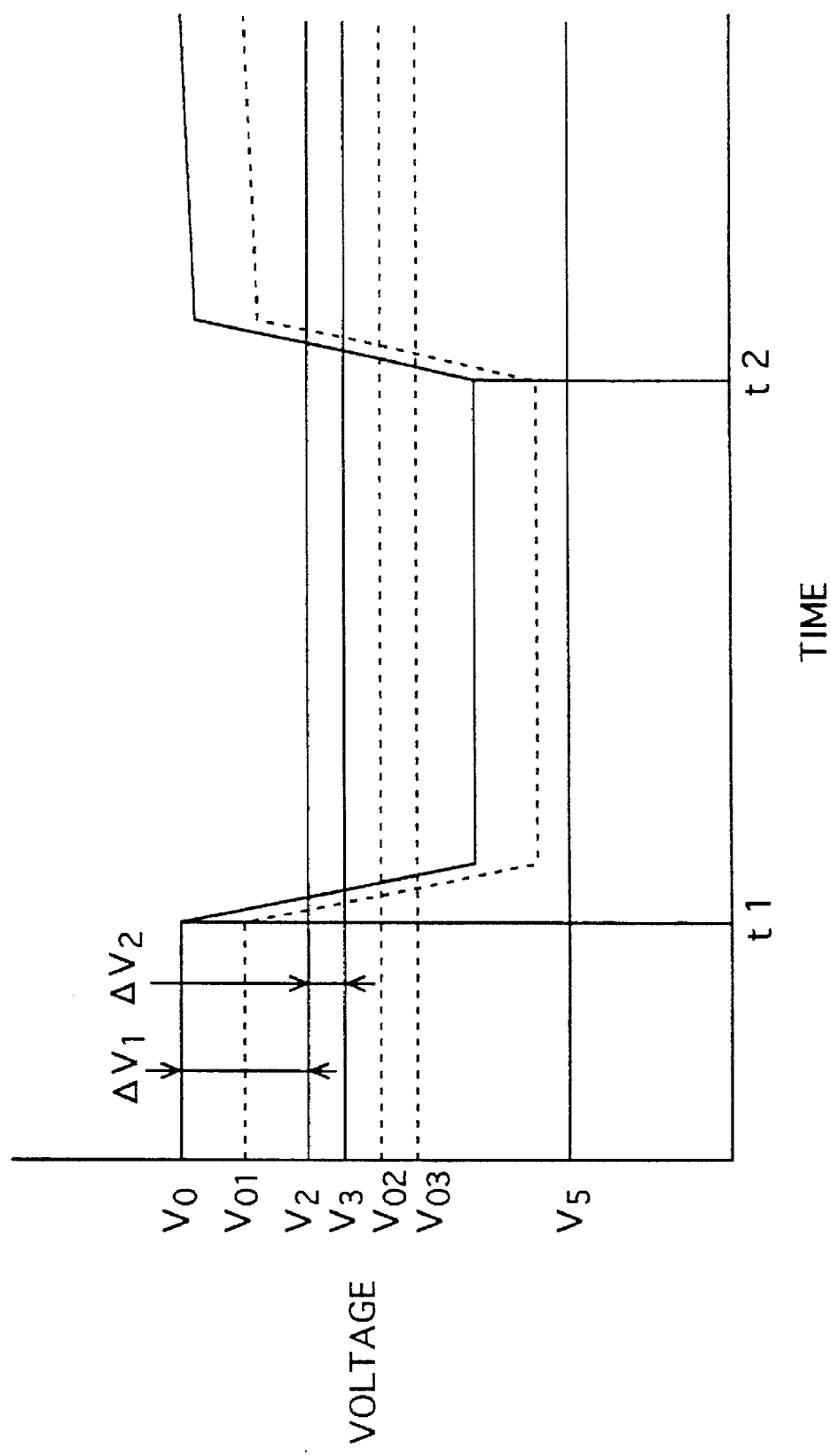

APPARATUS FOR DETECTING SEATED CONDITION FOR TOILET SEAT

BACKGROUND OF THE INVENTION

1. Field of the Invention

The present invention relates to an improvement related to the apparatus for detecting seated condition for toilet seat which detects whether a human body is seated on a toilet seat or not.

2. Description of the Related Art

In recent years, a toilet seat apparatus for washing the rectal area of a human body has been spreading. This apparatus washes or dries by warm air the rectal area of a human body, therefore thanks to this apparatus, a person can use the toilet healthfully and comfortably.

In the conventional toilet seat apparatus for washing the rectal area of a human body, there has been a apparatus for detecting a seated condition for toilet seat which detects whether a person is seated on a toilet seat or not. This conventional apparatus for detecting seated condition for toilet seat detects the approach of a human body to a toilet seat or detects a change in electrostatic capacity between electrodes by the contact. For instance, this conventional apparatus is described in Japanese Unexamined Patent Publication No. 258423/1992 (Kokai).

The apparatus described in Japanese unexamined Patent Publication No. 258423/1992 (Kokai) includes a determining circuit. This conventional determining circuit converts electrode capacity between one conductor and the other conductor to voltage, the other is provided in the inside of the toilet seat as the other electrode in the same way as one conductor as one electrode, by using electrostatic capacity-voltage conversion circuit. (As the other electrode, the ground may be used instead of the other conductor.) The determining circuit also determines whether a human body sits on a toilet seat or not by comparing the voltage obtained in the above-mentioned way with the amount of criterion which is predetermined in advance and this criterion amount is the fixed amount having the predetermined range which is set when the power source is inputted.

However the above-mentioned conventional apparatus has the following disadvantage because the amount of criterion is the fixed amount. The electrostatic capacity between two conductors is affected by the size, temperature and humidity of a human body. Therefore even if the seated or un-seated condition is in the same state, the amount of electrostatic capacity varies in response to each person's condition. When the variation of electrostatic capacity caused by the variations in size, temperature and humidity of a human body is too large to correspond, an error of detection occurs in.

SUMMARY OF THE INVENTION

It is an object of the present invention to provide an apparatus for detecting seated condition for toilet set which can correspond to the change in electrostatic capacity affected by the size, temperature and humidity of a human body and therefore can reduce the occurrence of error in detection to a large extent.

Accordingly, the present invention has been developed in view of the above-mentioned problem. The apparatus for detecting seated condition for toilet seat comprises:

a toilet seat which is rotatively displaced in the state in which an opening edge of a toilet seat is covered and in the state in which the toilet seat is apart from the opening edge;

a conductor provided in the inside of the toilet seat;

a means for detecting electrostatic capacity, in the from of electric information, which is existed between the conductor in the toilet seat in the state in which the opening edge of the toilet seat is covered and the ground or between the conductor and another conductor which is provided in the inside of the toilet seat; and a determining means which determines whether a human body is seated on the toilet seat or a human body is not seated on the toilet seat based on the electric information of the means for detecting electrostatic capacity, which compares s first set value for determining in response to the level of electric information which will be detected in the un-seated condition and a second set value for determining in response to the level of electric information which will be detected in the seated condition with electric information which is repeatedly outputted from the means for detecting electrostatic capacity, and which determines whether the seated condition in which a human is seated on the toilet seat or the the un-seated condition in which a human is not seated on the toilet seat based on the compared result.

According to the above-mentioned structure, the set value 1 for detecting un-seated condition and the set value 2 for detecting seated condition are computed and renewed in response to the change in input potential into the determining circuit. Therefore error of detection which is caused by the change in electrostatic capacity affected by the environmental variations such as temperature, humidity and installation location can be reduced to a large extent.

Other effects and advantages of other inventions will be apparent by the following explanations.

The invention in this patent application can renew the reference value which discriminates the seated condition from un-seated condition in response to the input potential, into the determining circuit, affected by the variations in size, temperature and humidity of a human body. So the present invention can reduce the error of detection to a large extent and can improve the reliability of the detecting apparatus.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure:

FIG. 5 is a diagram showing the changes in input potential into the determining circuit when changes going from un-seated condition to seated condition to un-seated condition are occurred in the first preferred embodiment.

DETAILED DESCRIPTION OF THE PREFERRED EMBODIMENT

Having generally described the present invention, a further understanding can be obtained by reference to the specific preferred embodiment which is provided herein for purposes of illustration only and are not intended to limit the scope of the appended claims.

A preferred embodiment of this invention will be hereinafter described with reference to the drawings.

Figure 1:
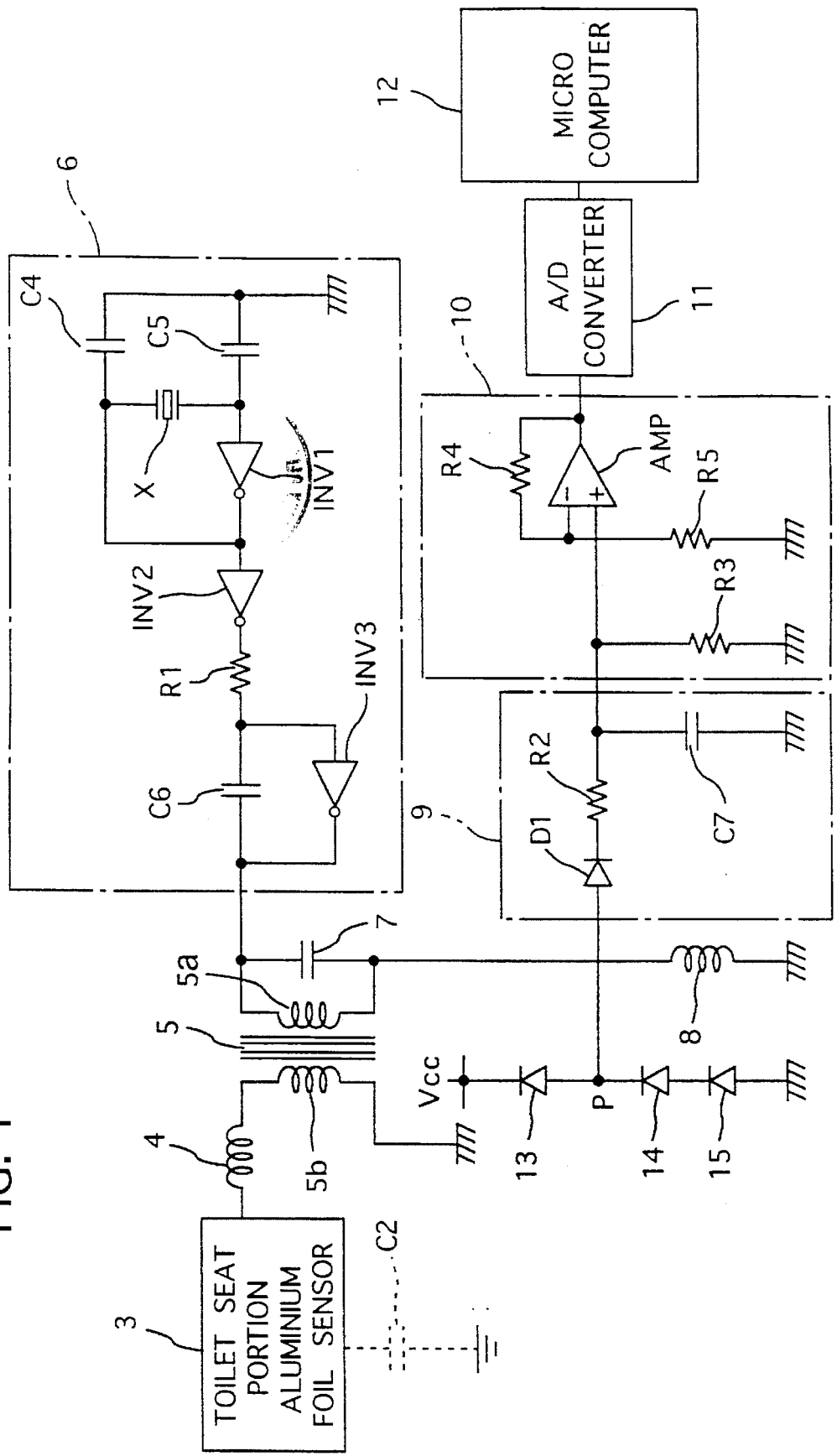
FIG. 1 is a circuit diagram showing the first preferred embodiment of the present invention.
Figure 2:
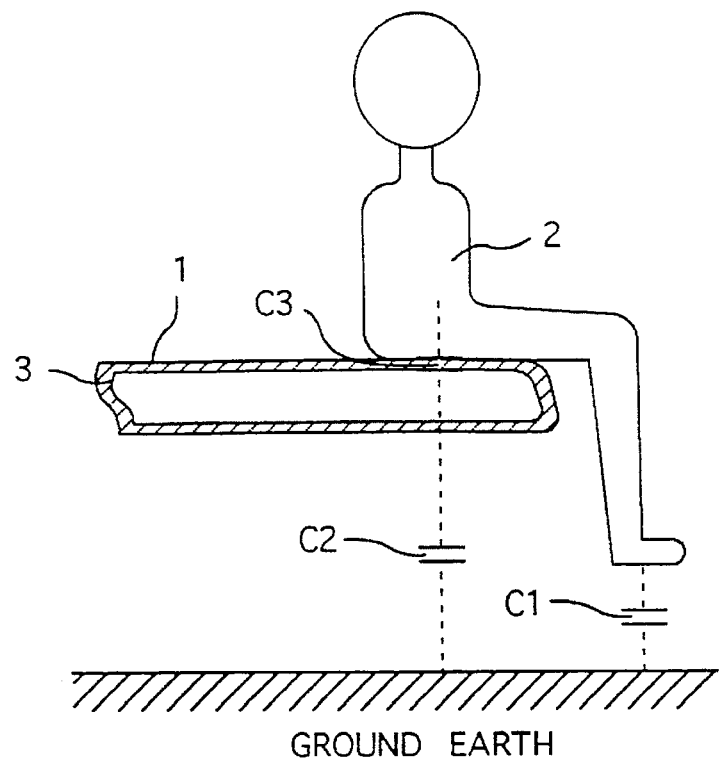
FIG. 2 is an explanation diagram for explaining the detection principle of the first preferred embodiment.

In FIG. 1, the reference number 3 denotes a conductor provided together with the electric heater which is provided at, for instance, the upper wall surface of inside cavity of a toilet seat 1 shown in FIG. 2. This conductor 3 is formed by thermal conduction aluminium foil or copper foil for effectively dispersing the heat released from the electric heater entirely toward the upper wall of a toilet seat. This conductor 3 is connected to a secondary coil 5b of the combined transformer 5 through the external electric wave absorber 4 by ferrite beads or ring (one-turn coil type). To a primary coil 5a of the combined transformer 5, the high-frequency signal, which is generated by an oscillating circuit 6 which is composed by C-MOS IC and ceramic oscillator, is supplied. The frequency of this high-frequency signal is selected to be the value which almost coincides with center frequency $f_o$ of resonance characteristic (shown in continuous curve in FIG. 3) caused by to-ground electrostatic capacity of a conductor 3 and the secondary coil 5b in the condition (hereinafter referred to as an un-seated condition) in which a person is not seated on the toilet seat 1. A capacity of a capacitor 7, which is provided together with the primary coil 5a, is set to coincide with the resonance condition of to-ground electrostatic capacity C2 of the conductor 3 in the un-seated condition.

The signal generated at both ends of above-mentioned primary coil 5a emerges at both ends of serial coil 8, which is for detecting, connected to the primary coil 5a in series. This signal detected by the serial coil 8 is inputted to the detection and smoothing circuit 9 which conducts smoothing effect together with enveloping detection by diode. Furthermore, the output of this detecting and smoothing circuit 9 is inputted to an A/D converter 11 through a direct amplifying circuit 10 which is composed of a computing amplifier and so forth. A microcomputer 12, into which the output of A/D converter 11 is inputted, together with A/D converter 11 is IC element which comprises the determining circuit of the present invention and lets a washing nozzle device and warm air drying mechanism in available conditions when the condition in which a person is seated on the toilet seat 1 is detected.

An oscillating circuit 6 comprises a ceramic oscillating element X, capacitors C4 through C6, logical inverters INV1 and INV2 and a resistance R1. The detecting and smoothing circuit 9 comprises a diode D1, a resistance R2 and a capacitor C7 and the amplifying circuit 10 comprises a computing amplifier AMP and resistances R3 through R5.

The resistance R1 of an oscillating circuit 6 reduces the output level (generally, amplifying level of power supply voltage 5 V of the integrated circuit) in response to the relation to the amplification factor of the amplifying circuit 10. The amplification factor of the amplifying circuit 10 is determined by the ratio of the resistor R5 to resistor R4.

As voltage restraint elements, diodes 13 to 15 are connected in series between the ground point and the direct voltage line Vcc for supplying power supply voltage of the detection and smoothing circuit 9. These diodes 13 to 15 impresses voltage, which is emerged between the connecting point P and diodes 13 to 15, to the anode of the diode D1. When the noise, in the spike state, appearing on the commercial alternating power supply line is superimposed on a direct voltage line Vcc, diodes 13 to 15 remove this noise.

Figure 3:
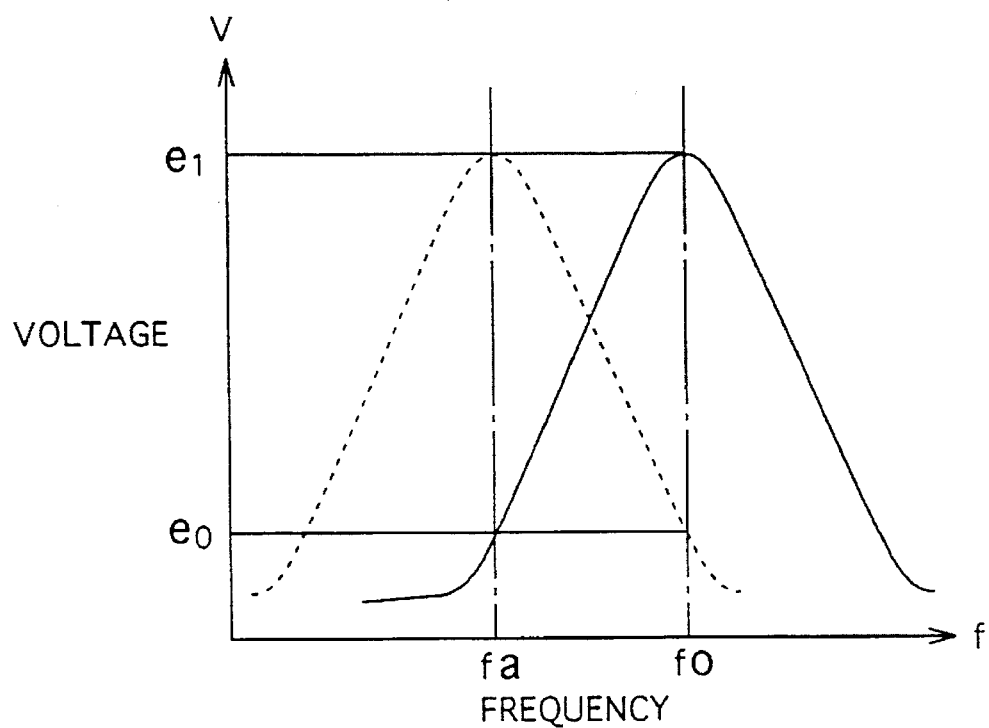
FIG. 3 is a characteristic diagram showing resonance characteristic for explaining the detection principle of the first preferred embodiment.

In the structure explained as above, as shown in FIG. 2, to-ground electrostatic capacity of the conductor 3, in the condition in which a person 2 is not seated on the toilet seat 1, may be indicated by C2. When the person 2 sits on the toilet seat 1, human-to-ground electrostatic capacity C1 and human-to-conductor electrostatic capacity C3 are added to C2. The change of electrostatic capacity, thereby, amounts to twice compared to that in the un-seated condition. The to-ground electrostatic capacity of the conductor 3 comprises the resonance circuit together with the secondary coil 5b. Therefore, the characteristic of the above-mentioned resonance circuit is expressed by the continuous curve as shown in FIG. 3 in the un-seated condition and it changes to the dotted curve as shown in FIG. 3 in the seated condition. The center frequency $f_a$ of this dotted curve is lower than that of the continuous curve. Accordingly, the high-frequency signal of the oscillating circuit 6 becomes high level $e_1$ in the input portion (connecting point P) of the detecting and smoothing circuit 9 in the un-seated condition and it becomes low level $e_0$ in the seated condition. This change in the signal level is detected by the direct coil 8. The detection and smoothing circuit 9 conducts the enveloping detection of both ends signal of the above-mentioned direct coil 8 and outputs s high level voltage in the un-seated condition and outputs a low level voltage in the seated condition. The output voltage of this detection and smoothing circuit 9 is converted into the digital signal by the A/D converter 11 and by using the microcomputer 12, the condition in which a person is seated on the toilet seat or not can be discriminated.

Figure 4:
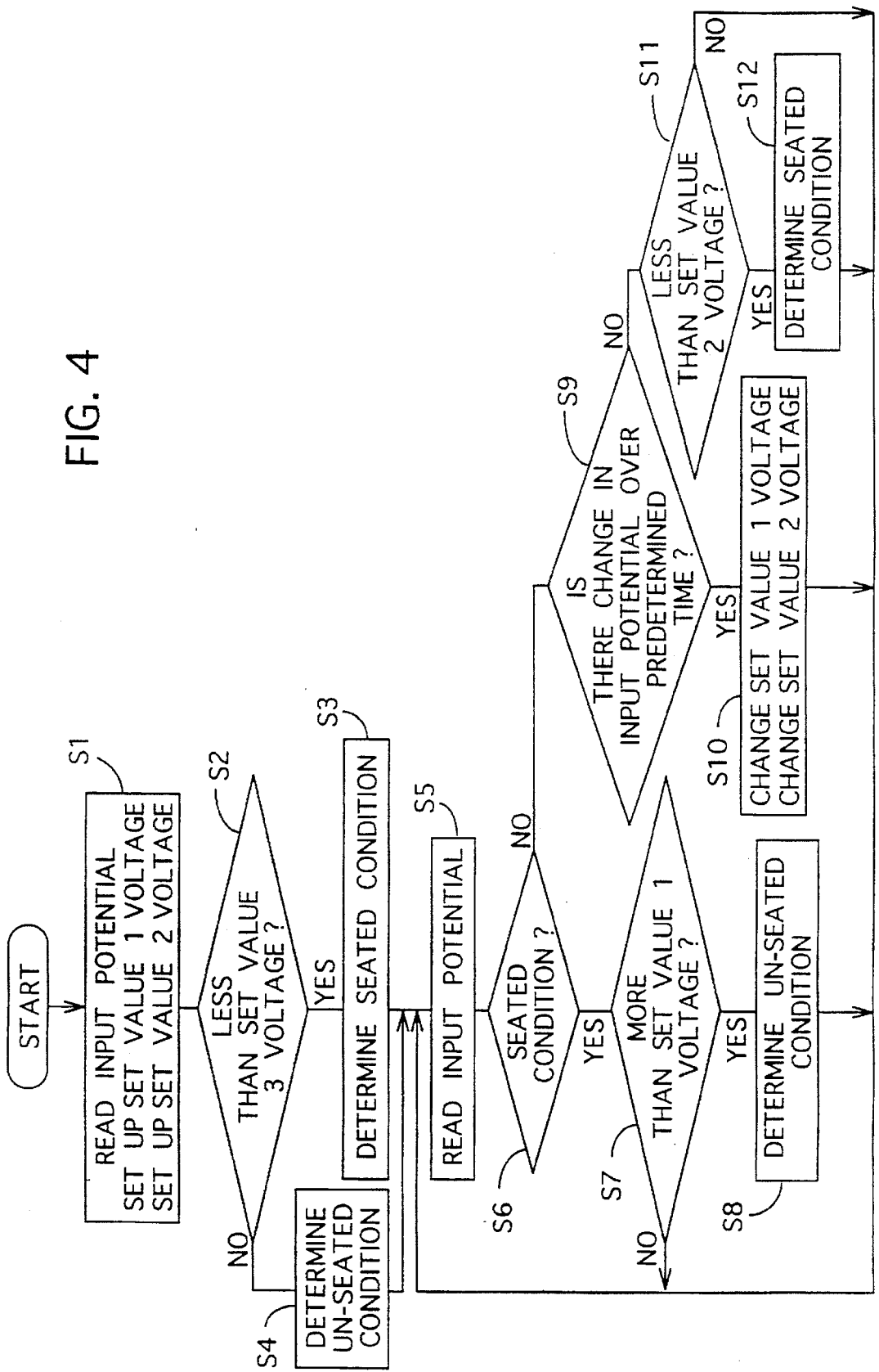
FIG. 4 is a flow chart showing the software in the microcomputer of the first preferred embodiment.

The software of the microcomputer 12 will be explained by reference to the flow chart of FIG. 4 and FIG. 5. In FIG. 4, when the power supply is inputted, at Step S1 an input potential ($V_O$ in FIG. 5) of the A/D converter 11 is read and based on this input voltage the set value 1 ($V_2$ in FIG. 5) for detecting the un-seated condition and the set value 2 ($V_3$ in FIG. 5) for detecting the seated condition are computed and set. This set value 1 is the value which is subtracted a predetermined value ($V_1$ in FIG. 5) from the input potential. The set value 2 is obtained by subtracting the predetermined value ($V_1$) and a hysteresis value ($V_2$ in FIG. 5) from the input potential. In selecting this predetermined value $V_1$ and the hysteresis value $V_2$, the change in electrostatic capacity in response to the size of a human body and the change in electrostatic capacity, which is caused by the water flow at the time of flushing the toilet after using should be considered. Next in Step S2, the input potential is checked whether it is less than the fixed set value 1 ($V_S$ in FIG. 5), which is set in advance for setting initial condition, or not. If the result is Y (yes), the seated condition is determined in Step S3 and if the result is N (No), the un-seated condition is determined in Step 4.

After that, the input potential is again read in step S5 and the un-seated condition or not is checked in Step S6. If the result in S6 is Y, whether the input voltage is more than the set value 1 or not is checked in Step S7. If the the result in Step S7 is N, it is returned to Step S5 and if the result in Step S7 is Y, the un-seated condition is determined in Step S8 and it is returned to Step S5. When the checking result is N in step S6, whether the change in the input potential over the predetermined time is existed or not is checked in Step S9. If the result in Step S9 is Y, the set value 1 ($V_{O2}$ in FIG. 5) and the set value 2 ($V_{O3}$ in FIG. 5) are computed and renewed based on the input potential ($V_{O1}$ in FIG. 5) which changed in step S10 and it is returned to Step S5. When the checking result in Step S9 is N, whether the input potential is less than the set value 2 or not is checked in Step S11. When the result in Step S11 is N, it is returned to Step S5 and when the result in Step S11 is Y, it is returned to Step S5 after the seated condition is determined in Step S12.

The predetermined time in Step S9 is the time for disregarding the voltage change in a short period of time caused by changes other than changes in persons and environmental features. The predetermined time in Step S9 is longer than the required time of sudden voltage change at the time when a human is seated and a human goes away from a toilet seat.

FIG. 5 shows a change in the input potential of A/D converter caused by the condition whether a human sits on or gets away from the toilet seat 1. The continuous line shows the condition which is before the electrostatic capacity is changed owing to the environmental changes such as temperature. The dotted line shows the condition which is after the electrostatic capacity is changed owing to the environmental changes such as temperature. In FIG. 5, the time t1 indicates the time at which a person sits on a toilet seat and the time t2 indicates the time at which a person gets away from a toilet seat. As shown in FIG. 5, the input potential $V_0$, which is in the seated and un-seated condition, is changed into $V_{01}$ corresponding to the change of electrostatic capacity caused by the environmental changes such as temperature and humidity. In response to this change, the set value $V_2$ and $V_3$ change into $V_{02}$, and $V_{03}$ respectively. Therefore the error in detection, which is caused by the change in electrostatic capacity owing to the changes such as size, temperature and humidity of a human who sits on a toilet seat, is greatly reduced.

By inputting the output of amplifying circuit 10 through an amplifying and inverting circuit into an A/D converter 11, the input potential of the determining circuit can be increased by sitting on a toilet seat. In that case, $V_S$, $V_2$ and $V_3$ is set to be higher than $V_0$.

Having now fully described the present invention, it will be apparent to one of ordinary skill in the art that many changes and modifications can be made thereto without departing from the spirit or scope of the present invention as set forth herein including the appended claims.

We claim:

1. An apparatus for detecting seated condition for toilet seat comprising:

a toilet seat which is rotatively displaced in the state in which an opening edge of a toilet seat is covered and in the state in which said toilet seat is apart from said opening edge;

a conductor provided in the inside of said toilet seat;

a means for detecting electrostatic capacity, in the form of electric information, which exists between said conductor in said toilet seat in the state in which the opening edge of said toilet seat is covered and the ground or between said conductor and another conductor which is provided in the inside of said toilet seat; and a determining means which determines whether a human body is seated on said toilet seat or a human body is not seated on said toilet seat based on said electric information of said means for detecting electrostatic capacity, which compares a first set value for determining in response to the level of electric information which will be detected in the un-seated condition and a second set value for determining in response to the level of electric information which will be detected in the seated condition with electric information which is repeatedly outputted from said means for detecting electrostatic capacity, and which determines whether the seated condition exists in which a human is seated on said toilet seat or the un-seated condition exists in which a human is not seated on said toilet seat based on said compared result;

wherein said determining means, when the present result of determining shows "un-seated condition", computes and renews said first set value for determining in response to electric information which is detected in seated condition and said second set value for determining in response to electric information which is detected in un-seated condition every time when the gradual change in electric information outputted from said means for detecting electrostatic capacity is detected.

2. An apparatus for detecting seated condition for toilet seat comprising:

a toilet seat which is rotatively displaced in the state in which an opening edge of a toilet seat is covered and in the state in which said toilet seat is apart from said opening edge;

a conductor provided in the inside of said toilet seat;

a means for detecting electrostatic capacity, in the form of electric information, which exists between said conductor in said toilet seat in the state in which the opening edge of said toilet seat is covered and the ground or between said conductor and another conductor which is provided in the inside of said toilet seat; and a determining means which determines whether a human body is seated on said toilet seat or a human body is not seated on said toilet seat based on said electric information of said means for detecting electrostatic capacity, which compares a third set value in response to electric information which will be detected immediately after a human is seated on said toilet seat with electric information which is outputted from said means for detecting electrostatic capacity and determines whether a human is seated on said toilet seat or not based on said compared result, which compares a first set value for determining in response to the level of electric information which will be detected in un-seated condition and a second set value for determining in response to the level of electric information which will be detected in the seated condition with electric information which is repeatedly outputted from said means for detecting electrostatic capacity, and which determines whether the seated condition exists in which a human is seated on said toilet seat or the un-seated condition exists in which a human is not seated on said toilet seat based on said compared result;

wherein said determining means, when the present result of determining shows "un-seated condition", computes and renews said first set value for determining in response to electric information which is detected in seated condition and said second set value for determining in response to electric information which is detected in un-seated condition every time when the gradual change in electric information outputted from said means for detecting electrostatic capacity is detected.

3. An apparatus for detecting seated condition for toilet seat according to claim 2, wherein said determining means, when the present result of determining shows "un-seated condition", repeats to compare the electric information detected from said means for detecting electrostatic capacity and said third set value for determining until it determines "seated condition".

4. An apparatus for detecting seated condition for toilet seat according to claim 1 wherein said determining means, when the present result of determining shows "seated condition", repeats to compare the electric information detected from said means for detecting electrostatic capacity and said first set value for determining until it determines "un-seated condition".

5. An apparatus for detecting seated condition for toilet seat according to claim 1, wherein said determining means, when the present result of determining shows "un-seated condition", repeats to compare the electric information detected from said means for detecting electrostatic capacity and said third set value for determining until it determines "seated condition".

6. An apparatus for detecting seated condition for toilet seat according to claim 1, wherein said means for detecting electrostatic capacity comprises:

an oscillating circuit which generates high-frequency signal;

a transformer whose primary coil is connected with the output end of said oscillating circuit and whose secondary coil is connected with said conductor; and a detection and smoothing circuit which is connected with said primary coil of said bonding transformer and which conducts the enveloping detection and smoothing of high-frequency signal whose amplitude changes, from said oscillating circuit, based on the change in resonance characteristic caused by said secondary coil and electrostatic capacity between said conductor which is connected with said primary coil of said bonding transformer and which is provided in the inside of said toilet seat and the ground, or between said conductor and another conductor which is provided in the inside of said toilet seat.

7. An apparatus for detecting seated condition for toilet seat according to claim 2, wherein said means for detecting electrostatic capacity comprises:

an oscillating circuit which generates high-frequency signal;

a transformer whose primary coil is connected with the output end of said oscillating circuit and whose secondary coil is connected with said conductor; and a detection and smoothing circuit which is connected with said primary coil of said bonding transformer and which conducts the enveloping detection and smoothing of high-frequency signal whose amplitude changes, from said oscillating circuit, based on the change in resonance characteristic caused by said secondary coil and electrostatic capacity between said conductor which is connected with said primary coil of said bonding transformer and which is provided in the inside of said toilet seat and the ground, or between said conductor and another conductor which is provided in the inside of said toilet seat.

8. An apparatus for detecting seated condition for toilet seat according to claim 2 wherein said determining means, when the present result of determining shows "seated condition", repeats to compare the electric information detected from said means for detecting electrostatic capacity and said first set value for determining until it determines "un-seated condition".

* * * * *